United States Patent [19]

Leger

[11] 4,343,530
[45] Aug. 10, 1982

[54] WAVE SOLDERABLE QUICK DISCONNECT MALE TERMINAL FOR PRINTED CIRCUIT BOARDS

[75] Inventor: Laurie J. Leger, Bradford, Mass.

[73] Assignee: Honeywell Information Systems Inc., Waltham, Mass.

[21] Appl. No.: 110,881

[22] Filed: Jan. 10, 1980

[51] Int. Cl.³ .............................................. H01R 4/16
[52] U.S. Cl. .................................. 339/220 R; 29/838; 339/17 C; 339/275 B
[58] Field of Search ............. 339/17 C, 221 R, 275 B, 339/220 R; 29/837, 838, 882

[56] References Cited

U.S. PATENT DOCUMENTS 3,660,726  5/1972  Ammon et al. .................... 339/17 C
4,119,360  10/1978  Linkowski ............................ 29/882
4,187,606  2/1980  Sinclair ................................. 29/882

FOREIGN PATENT DOCUMENTS 266177  7/1964  Netherlands ...................... 339/17 C

*Primary Examiner*—John McQuade
*Attorney, Agent, or Firm*—William A. Linnell; Nicholas Prasinos

[57] ABSTRACT

A quick disconnect male terminal is disclosed having a stem which is inserted into a circular hole in the printed circuit board prior to wave soldering the terminal to the printed circuit board. The terminal is designed to use minimal material, to use little surface area on the printed circuit board, and be easily assembled into printed circuit boards. The terminal stem is embossed with a V-shape to increase its strength and to increase the solder wicking action through the hole in the printed circuit board. The tip of the V-shaped terminal stem protruding through the hole in a printed circuit board may also be flattened as a means of affixing the terminal prior to wave soldering.

8 Claims, 10 Drawing Figures

U.S. Patent
Aug. 10, 1982
4,343,530
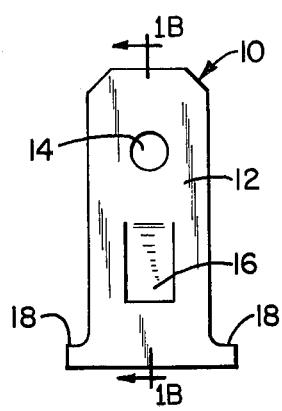
FIG. 1A
PRIOR ART
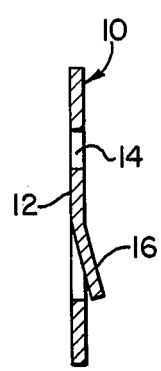
FIG. 1B
PRIOR ART
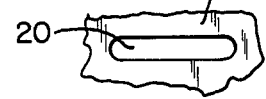
FIG. 1C
PRIOR ART
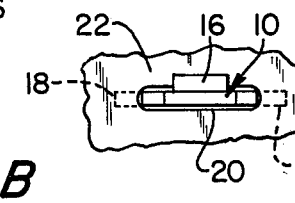
FIG. 2
PRIOR ART
FIG. 3
PRIOR ART
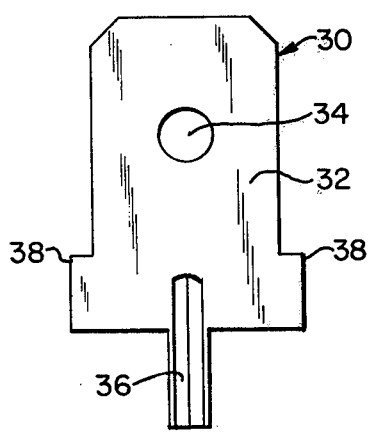
FIG. 4A
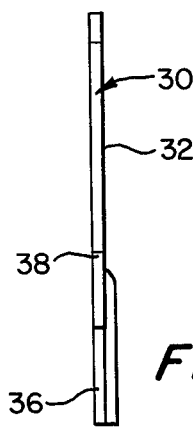
FIG. 4B
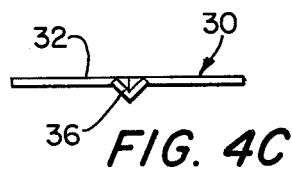
FIG. 4C
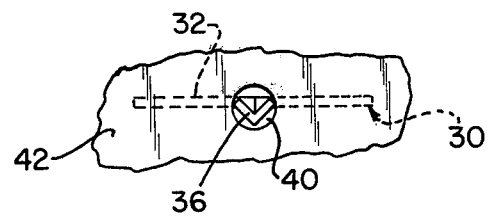
FIG. 6
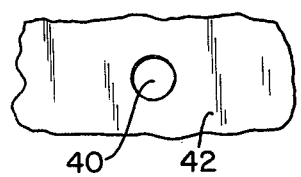
FIG. 5

WAVE SOLDERABLE QUICK DISCONNECT MALE TERMINAL FOR PRINTED CIRCUIT BOARDS

BACKGROUND OF THE INVENTION

This invention relates to the field of modular electronic assemblies and, more particularly, to quick disconnect terminals for electronically coupling wire leads to printed circuit (p.c.) boards.

With the advent of printed circuits, many attempts have been made to design quick disconnect terminals for printed circuit boards in which one or more wire leads are terminated in a quick disconnect terminal (usually a female terminal) which in turn leads to a corresponding terminal (usually a male terminal) which is affixed to the printed circuit board. However, many prior terminal designs have resulted in a substantial cost for the terminal which is connected to the printed circuit board or a substantial cost in preparing the printed circuit board to receive the quick disconnect terminal or in the assembly costs of affixing the terminal to the printed circuit board.

One such present quick disconnect male terminal is formed in the shape of an L such that the vertical portion of the L, which is perpendicular to the surface of the p.c. board, is used to mate with the standard female quick disconnect terminal connected to one or more wire leads. In this type of terminal, the horizontal portion of the L is affixed to the surface of the printed circuit board by means of an eyelet which is pushed through a hole in the printed circuit board from the opposite side of the printed circuit board and into a hole in the horizontal member of the L-shaped terminal. This eyelet is then peened over on the horizontal member of the L-shaped terminal securely affixing the quick disconnect terminal to the surface of the printed circuit board. This same L-shaped quick disconnect terminal could be equally affixed to the printed circuit board by means of rivets or bolts. Although these L-shaped quick disconnect terminals provide sufficient rigidity to allow the wire lead terminal to be disconnected from the printed circuit board L-shaped terminal without tearing the printed circuit board terminal from the printed circuit board, they have the disadvantages that the terminals themselves are expensive, affixing the terminal to the board is time consuming, and a relatively large amount of area on both sides of the printed circuit board is required for mounting the terminal. However, this L-shaped quick disconnect terminal does have the advantage that this method of affixing may be used on either male or female quick disconnect terminals.

Another quick disconnect terminal design, described more fully hereinafter, reduces many of these disadvantages. In this design, which is limited to male type quick disconnect terminals, an oblong hole is routed in the printed circuit board and the male terminal is inserted from the opposite side of the printed circuit board. In this male terminal design, the terminal blade has a spring clip punched in the lower portion of the terminal blade such that the spring retracts when the terminal is pushed through the printed circuit board and then springs into place locking the terminals such that it will not fall out of the hole in the printed circuit board. Further, the base of the terminal on the side of the printed circuit board opposite the blade is wider than the oblong hole, thereby retaining the terminal from falling out of the hole in the other direction. After this male terminal is inserted in the oblong hole in the printed circuit board, the terminal is then hand-soldered to the printed circuit board. Although the cost of the terminal itself is reduced by this design, and the area on the printed circuit board required for mounting this terminal is reduced, this design has the disadvantage that the routing of the oblong hole in the printed circuit board is more time consuming than simply drilling a circular hole and the hand-soldering of the terminal to the printed circuit board is a separate costly step. Routing has the further disadvantage that the routing tool will not last as long as a drill and secondly a routing operation does not permit multiple boards to be stacked and prepared simultaneously as is possible when only a circular hole is required to be drilled.

It is accordingly an object of the present invention to provide a quick disconnect terminal having a low per terminal cost and a low assembly cost. A further object is to provide a terminal which requires very little surface area on the printed circuit board for mounting but yet has the requisite rigidity and strength to withstand the pushing, pulling and the bending associated with connecting and disconnecting the mating wire lead terminal with the printed circuit board terminal. A still further object is to provide a quick disconnect terminal which may be retrofitted to existing printed circuit board designs without requiring a change in the artwork of the circuits on the board. It is still a further object to provide a quick disconnect terminal which can be wave-soldered to the printed circuit board.

This invention is pointed out with particularity in the appended claims. An understanding of the above and further objects and advantages of this invention may be obtained by referring to the following descriptions taken in conjunction with the drawings.

SUMMARY OF THE INVENTION

In accordance with the principles of the instant invention a wave solderable terminal is manufactured comprising a terminal blade and a rectangular stem formed at the base of the terminal blade. The stem is formed into a V-shape cross-section which also extends into the base of the terminal blade. The V-shape in the stem and the base of the terminal blade increase the strength of the stem and terminal blade base and aid the flow of solder after the stem is inserted into a circular hole in a printed circuit board. The base of the terminal is formed so that it is wider than the width of the terminal blade itself such that shoulders extend on either side of the terminal blade which can be used to absorb the driving force of a tool used to insert the terminal into a circular hole in the printed circuit board sized to provide a snug interference fit. By providing that the stem of the terminal is longer than the thickness of the printed circuit board, the tip of the V-shaped stem protruding through the printed circuit board on the side opposite the terminal blade may be flattened thereby helping to retain the terminal in the printed circuit board prior to being wave soldered without interferring with the flow of solder through the circular hole in the printed circuit board. The V-shaped stem and base portion may be formed by embossing, using a right angle die radiused at the top to reduce stress in the terminal base. The terminal itself may be stamped from ½ hard cold rolled brass with a grain direction running lengthwise to the stem. By forming the terminal by first stamping the terminal from a metal sheet and then embossing the V-shape, the stem can be formed such that only two corners of the stem come in contact with the sides of the circular hole thereby reducing the force necessary to insert the terminal into the printed circuit board.

BRIEF DESCRIPTION OF THE DRAWINGS

The manner in which the apparatus of the present invention is constructed and its mode of operation can best be understood in light of the following detailed description together with the accompanying drawings in which like reference numerals identify like elements in the several figures and in which:

FIG. 1A, FIG. 1B, and FIG. 1C are front elevation view, side elevation sectional view, and bottom plan view respectively, of a prior art quick disconnect male terminal;

FIG. 2 is a top plan view of a portion of a printed circuit board with a hole sized to receive the prior art quick disconnect male terminal illustrated in FIG. 1;

FIG. 3 is a top plan view of a portion of a printed circuit board showing the prior art quick disconnect male terminal fully inserted in a hole of the type illustrated in FIG. 2;

FIG. 4A, FIG. 4B, and FIG. 4C are front elevation view, side elevation view, and bottom plan view respectively, of a quick disconnect male terminal incorporating the present invention;

FIG. 5 is a bottom plan view of a portion of a printed circuit board with a hole sized to receive the quick disconnect terminal of the present invention; and FIG. 6 is a bottom plan view of a portion of a printed circuit board showing the quick disconnect male terminal of the present invention fully inserted in a hole of the type illustrated in FIG. 5.

DETAILED DESCRIPTION OF THE PREFERRED EMBODIMENT

Referring to FIG. 1A, a prior art quick disconnect male terminal 10 comprises a terminal blade 12, a hole 14 in the terminal blade, a spring clip 16, and base tabs 18. The hole 14 in terminal blade 12 is provided to receive the convex dimple or spring clip in a mating standard quick disconnect female terminal which is pushed onto a terminal blade 12 and thereby help maintain the female terminal in contact with male terminal 10. As most clearly illustrated in FIGS. 1B and 1C, spring clip 16 is formed by punching a rectangular spring in terminal blade 12 such that the bottom end of clip 16 protrudes furthest from the surface of terminal blade 12.

Referring again to FIG. 1A, base tabs 18 at the base of terminal blade 12 are provided so that the base of the male terminal 10 is wider than the length of the oblong hole in the printed circuit board in which the terminal will be inserted.

Refer now to FIG. 2 which illustrates a portion of printed circuit board 22 containing oblong hole 20 sized to receive the male terminal 10. Hole 20 is sized so that the length is sufficient to accommodate the width of terminal blade 12 but yet be less than the width of terminal blade 12 plus base tabs 18 such that the base tabs 18 prevent the terminal blades from passing completely through hole 20. For example, in one such present male terminal 10 the width of the base of the terminal including base tabs 18 is 0.280 inches and the length of hole 20 is 0.200 inches to accommodate a terminal blade 12 of 0.185 inches. The width of hole 20 is sized such that it will accommodate the thickness of the terminal blade plus the spring clip 16 in a partially deflected position. For example, in one such present male terminal 10, as is best illustrated in FIG. 1B, the thickness of the material used in the terminal blade is 0.020 inches and the spring clip 16 extends beyond the surface of the terminal blade 0.025 inches such that the distance from the tip of the spring clip to the opposite side of the terminal blade is 0.045 inches and the width of hole 20 in FIG. 2 sized to receive the terminal is 0.035 inches. Thus, referring to FIG. 3 it can be appreciated that when the male terminal 10 is fully inserted in hole 20 in printed circuit board 22 base tabs 18 retain the terminal on one side of the printed circuit board 22 and spring clip 16 in its fully extended position after passing through hole 20 retain the male terminal 10 on the other side of the printed circuit board 22.

Referring now to FIG. 1A, it can be appreciated that the distance between the top of base tabs 18 and the bottom of spring clip 16 must be sufficient to accommodate the thickness of the printed circuit board. Again in one such present male terminal 10, this distance is 0.078 inches and the male terminal tab is used in printed circuit board ranging between 0.062 inches and 0.072 inches in thickness. As can be appreciated by referring to FIG. 1B and FIG. 3, the relative loose fit of male terminal 10 within the hole 20 in printed circuit board 22 and the fact that the terminal is supported in only one direction by spring clip 16, the male terminal 10 must be held in a vertical position perpendicular to the surface of printed circuit board 22 during the soldering operation. In practice this mandates that the male terminal 10 be hand-soldered to the printed circuit board. As can also be appreciated by referring to FIG. 1B, several different length terminals may be required to accommodate printed circuit boards of a wide range of thicknesses if the distance between the end of spring clip 16 and base tabs 18 is not sufficient to accommodate the thicker printed circuit boards.

Referring to FIG. 4A, the quick disconnect male terminal 30 of the present invention comprises a terminal blade 32, a hole 34, shoulders 38, and stem 36. As in the prior art terminal, hole 34 in terminal blade 32 is provided to receive the convex dimple or spring clip in the mating standard quick disconnect female terminal which is pushed onto terminal blade 32 and thereby help maintain the female terminal in contact with male terminal 30. Shoulders 38 provide a stop for the mating female quick disconnect connector such that it may not be pushed too far onto terminal blade 32 and also provide more material at the base of the terminal to be soldered to the surface of the printed circuit board. The top surfaces of shoulders 38 are also used to absorb the downward insertion force applied by a hand or automatic machine insertion tool used to force the stem into its circular receiving hole in the printed circuit board thus preventing the bending of the relatively thin terminal blade 32 or the introduction of any burrs which might interfere with the mating of a quick disconnect female terminal.

Stem 36 is V-shaped as is best illustrated in FIG. 4C. The V-shape in stem 36 is formed after the outline of the terminal illustrated in the FIG. 4A is stamped from a sheet of terminal material. In a preferred embodiment, the male terminal 30 is stamped from cold rolled 178 hard brass with the grain direction running lengthwise to stem 36. After the terminal is stamped from the sheet, the V-shape of stem 36 is formed by embossing the stem and the base of the terminal with a right angled die that is radiused at its top such that the top of the V-shape stem is radiused and undue stress is not placed in the base of the terminal. As is illustrated in FIG. 4C, after the V-shape is embossed in stem 36 the sides of the V are at 90 degrees to each other and 45 degrees with respect to the surface of the terminal blade 32.

FIG. 5 illustrates a portion of a printed circuit board 42 in which a circular hole 40 has been made to receive stem 36 of male terminal 30. The diameter of hole 40 and the width of stem 36 are sized such that the terminal may be inserted by hand in the hole for a snug interference fit. For example, in the preferred embodiment the width of the stem 36 is 0.060 inches plus or minus 0.002 inches and the hole in the printed circuit board is a nominal 0.061 inch diameter hole. After being drilled, hole 40 is plated through with 0.001 inches of copper resulting in a finished hole of 0.059 inches diameter. A snug fit of stem 36 in hole 40 assures that the surface of terminal blade 32 will be perpendicular to the surface of the printed circuit board and that the terminal will remain in the hole after being inserted and prior to being soldered such that the printed circuit board may be handled and placed upside down without the terminal falling out of hole 40. After being temporarily affixed to the printed circuit board by inserting stem 36 into hole 40, the male terminal 30 can then be permanently affixed to the printed circuit board by soldering the base of the terminal and stem to the printed circuit board. This soldering operation may be accomplished by use of wave or dip soldering equipment in which the printed circuit board is placed with the terminal in the down position such that sufficient solder is deposited at the intersection of the base of the terminal blade and the copper etch on the surface of the printed circuit board thus assuring a sufficient solder deposit to withstand the pulling, pushing and bending associated with connecting and disconnecting the mating female terminal which contains the wire leads.

As illustrated in FIG. 6, stamping the terminal from the sheet metal material and then embossing the V in the terminal base and stem results in only two corners of the stem being in contact with the side of circular hole 40 thereby reducing the amount of force needed to insert stem 36 into hole 40. This is particularly advantageous when larger sized terminals of relatively thick material with large stems are inserted into large size holes. If the stem was flat, as opposed to V-shaped, or if the V-shape was embossed before the terminal was stamped from the sheet material, the four corners of the stem would be in contact with the side of the circular hole in the printed circuit board thereby requiring greater insertion force than required when only two edges are in contact. The V-shape in the base of the terminal blade and stem also increases the strength of the terminal thereby making it more difficult to bend the terminal from its position of being perpendicular to the surface of the printed circuit board. The V-shape embossed in stem 36 has the dual advantage that it provides more terminal material within the hole of the printed circuit board and it also aids in increasing the wicking action such that more solder is drawn into the hole in the printed circuit board thereby increasing the rigidity and strength of the bond. This improved solder wicking action is particularly important on larger size terminals having larger sized stems for larger sized holes.

By sizing the length of stem 36 so that a small portion of the stem projects above the surface of the opposite side of the printed circuit board 42, it is possible to flatten the V-shape by providing downward pressure to the ends of each arm of the V and upward pressure to the intersection of the arms as illustrated in FIG. 6. This flattening operation may be easily accomplished by manually squeezing the end of the stem 36 projecting through the printed circuit board with a pair of pliers such that the opening in the jaws of the pliers is parallel to the terminal blade 32 and applying pressure. This flattening of the end of stem 36 can be used prior to soldering the male terminal 30 to the printed circuit board when it is felt that the terminal must be temporarily attached to the printed circuit board by a means more secure than that provided by the interference fit. This flattening operation more securely affixes the terminal to the printed circuit board by increasing the width of the stem 36 so that it is greater than the diameter of hole 40 but yet does not interfere with the flow of solder through the hole 40 which would be done if the end of stem 36 peened or otherwise bent over onto the surface of the printed circuit board. As can be appreciated by comparing FIG. 6 with FIG. 3, male terminal 30 of the present invention is a direct replacement for male terminal 10 of the prior art because hole 40 can be easily substituted for hole 20. Further, this substitution can be done without requiring any change in the etch artwork on the printed circuit board. It can also be appreciated that circular hole 40 can be easily drilled through a stack of multiple printed circuit boards while other drilling operations are being performed and does not require the separate routing operation on a single printed circuit board as is required to make oblong hole 20. It can further be appreciated that the relatively small size of circular hole 40 takes less area on the p.c. board than required by male terminal 10 or other prior art terminals. This reduced area permits more etch runs within the internal etches of multilayer p.c. boards and more etch runs on the surface opposite the terminal.

In practice it has been found that by properly sizing the length of stem 36 in the preferred embodiment, one male terminal 30 can be used on a far greater range of thicknesses on printed circuit boards than possible with the prior art male terminal 10.

Although the present invention has been described in terms of a quick disconnect male terminal, it is envisioned that many of the principles of the present invention could be employed with respect to a quick disconnect female terminal. It is also envisioned that if greater strength is required or if it is desired to make the terminal less easy to rotate within the holes in the printed circuit board prior to soldering, a plurality of stems could be used at the base of the terminal.

While the invention has been particularly described and shown with reference to a preferred embodiment, it will be understood by those skilled in the art that the foregoing and other changes in form, dimensions and detail may be made herein without departing from the spirit and scope of the invention.

Having described the invention, what is claimed as new and novel and for which it is desired to secure Letters Patent is:

1. A wave solderable terminal for making an electrical connection to a printed circuit board comprising:
   A. a terminal blade having a base;
   B. a V-shaped cross-section stem at said base of said terminal blade; and
   C. a portion of said base of said terminal blade adjacent to said V-shaped stem also having a V-shaped cross-section, wherein each side of said V-shaped stem is at an angle substantially equal to 90 degrees with respect to another side of said V-shaped stem and at an angle substantially equal to 45 degrees with respect to a surface of said terminal blade, and wherein said portion of said base is radiused at the top of said V-shape such that undue stress is not placed in said base.

2. The wave solderable terminal as claimed in claim 1 wherein said V-shaped stem is formed by embossing said stem and said base with a right angle die which is radiused at the top such that said V-shaped cross-section is embossed in said stem and said base with the end of said V-shaped cross-section in said base radiused.

3. The wave solderable terminal as claimed in claim 2 wherein said wave solderable terminal is stamped from cold rolled ½ hard brass with a grain direction running lengthwise in said V-shaped stem.

4. The wave solderable terminal as claimed in claim 3 wherein said wave solderable terminal is a quick disconnect male type terminal.

5. The wave solderable terminal as claimed in claim 1 wherein said base is wider than said terminal blade such that a top edge of said base forms a pair of shoulders with respect to said terminal blade thereby providing a driving surface for terminal insertion and increasing the amount of terminal blade material in contact with a printed circuit board and providing a stop for a mating terminal connector.

6. The wave solderable terminal as claim in claim 1 wherein said V-shaped stem is sufficiently longer than the thickness of said printed circuit board on which said wave solderable terminal is mounted such that a tip of said V-shaped stem projects through said printed circuit board such that said tip may be flattened thereby retaining said wave solderable terminal in said printed circuit board prior to being wave soldered and without interfering with the flow of solder in said circular hole.

7. The wave solderable terminal as claimed in claim 1 wherein said V-shaped stem is formed such that only two corners of said V-shaped stem are in contact with a circular hole in said printed circuit board on which said wave solderable terminal is mounted wherein said circular hole is sized to provide a snug interference fit for said V-shaped stem.

8. A method of retaining a wave solderable terminal in a circular hole drilled in a printed circuit board, comprising:
A. inserting a V-shaped cross-section stem of said wave solderable terminal into said circular hole in said printed circuit board such that a tip of said stem protrudes through said circular hole; and
B. flattening said tip of said stem with sufficient force to increase the angle between each side of said V-shaped cross-section stem such that the width of said tip of said stem is greater than the diameter of said circular hole in said printed circuit board.

* * * * *